US012325909B2

(12) United States Patent
Jansen et al.

(10) Patent No.: US 12,325,909 B2
(45) Date of Patent: Jun. 10, 2025

(54) EM SOURCE FOR ENHANCED PLASMA CONTROL

(71) Applicant: Applied Materials, Inc., Santa Clara, CA (US)

(72) Inventors: Alexander Jansen, San Jose, CA (US); Keith A. Miller, Mountain View, CA (US); Prashanth Kothnur, San Jose, CA (US); Martin Riker, Milpitas, CA (US); David Gunther, Santa Clara, CA (US); Emily Schooley, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/861,969

(22) Filed: Jul. 11, 2022

(65) Prior Publication Data

US 2022/0341029 A1   Oct. 27, 2022

Related U.S. Application Data

(63) Continuation of application No. 16/930,794, filed on Jul. 16, 2020, now Pat. No. 11,692,262.

(60) Provisional application No. 62/874,503, filed on Jul. 16, 2019.

(51) Int. Cl.
*C23C 14/35* (2006.01)
*C23C 14/34* (2006.01)
*H01J 37/34* (2006.01)

(52) U.S. Cl.
CPC ........ *C23C 14/354* (2013.01); *C23C 14/3407* (2013.01); *C23C 14/3471* (2013.01); *H01J 37/3455* (2013.01); *H01J 37/3458* (2013.01); *H01J 37/3461* (2013.01)

(58) Field of Classification Search
CPC .............................. C23C 14/354; C23C 14/35
See application file for complete search history.

(56) References Cited

U.S. PATENT DOCUMENTS

| 4,746,417 | A  | * | 5/1988  | Ferenbach ............ H01J 37/347 |
|           |    |   |         | 204/192.12 |
| 5,174,875 | A  |   | 12/1992 | Hurwitt et al. |
| 5,262,030 | A  |   | 11/1993 | Potter |
| 5,284,564 | A  | * | 2/1994  | Maass ..................... C23C 14/35 |
|           |    |   |         | 204/192.12 |
| 6,132,565 | A  |   | 10/2000 | Lin |
| 8,778,145 | B2 | * | 7/2014  | Watanabe .......... H01J 37/3408 |
|           |    |   |         | 204/192.12 |

(Continued)

FOREIGN PATENT DOCUMENTS

| CN | 101031989 A | 9/2007 |
| CN | 107109632 A | 8/2017 |

(Continued)

OTHER PUBLICATIONS

Translation to Hosaka (JP H04-002772) published Jan. 1992.*
PCT International Search Report and Written Opinion in PCT/US2020/042297 dated Oct. 23, 2020, 10 pages.

*Primary Examiner* — John J Brayton
(74) *Attorney, Agent, or Firm* — Servilla Whitney LLC (57) ABSTRACT

Apparatus and methods for controlling plasma profiles during PVD deposition processes are disclosed. Some embodiments utilize EM coils placed above the target to control the plasma profile during deposition.

14 Claims, 5 Drawing Sheets

(56) References Cited

U.S. PATENT DOCUMENTS

| | | | |
|---|---|---|---|
| 2004/0050690 | A1 | 3/2004 | Green et al. |
| 2008/0308416 | A1 | 12/2008 | Allen et al. |
| 2011/0108416 | A1* | 5/2011 | Liu .................... C23C 14/3407 |
| | | | 204/298.21 |
| 2014/0042023 | A1 | 2/2014 | Ritchie et al. |
| 2015/0332898 | A1 | 11/2015 | Yokota et al. |
| 2018/0025895 | A1* | 1/2018 | Riker ................ H01J 37/32082 |
| | | | 204/192.13 |

FOREIGN PATENT DOCUMENTS

| | | | | |
|---|---|---|---|---|
| EP | 0825277 | A2 | 2/1998 | |
| JP | H0230757 | A | 2/1990 | |
| JP | 04002772 | A * | 1/1992 | ............. C23C 14/35 |
| JP | H042772 | A | 1/1992 | |
| JP | H1088342 | A | 4/1998 | |
| JP | H116062 | A | 1/1999 | |
| JP | 2000313957 | A | 11/2000 | |
| JP | 2002093784 | A | 3/2002 | |
| KR | 20160006593 | A | 1/2016 | |
| TW | I527924 | B | 4/2016 | |

* cited by examiner

EM SOURCE FOR ENHANCED PLASMA CONTROL

CROSS-REFERENCE TO RELATED APPLICATIONS

This application is a continuation of U.S. patent application Ser. No. 16/930,794, filed Jul. 16, 2020, which claims priority to U.S. Provisional Application No. 62/874,503, filed Jul. 16, 2019, the entire disclosures of which are hereby incorporated by reference herein.

TECHNICAL FIELD

Embodiments of the present disclosure generally relate to apparatus and methods for controlling plasma. More specifically, embodiments of the disclosure relate to apparatus and methods for controlling plasma profiles in PVD deposition processes using electromagnets.

BACKGROUND

Sputtering, alternatively called physical vapor deposition (PVD), is used for the deposition of metals and related materials in the fabrication of semiconductor integrated circuits. The use of sputtering has also been extended to depositing metal layers onto the sidewalls of high aspect-ratio holes such as vias or other vertical interconnect structures, as well as in the manufacture of extreme ultraviolet (EUV) mask blanks.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Argon is admitted to the chamber. In the sputtering processes, the sputtering target is bombarded by energetic ions, such as a plasma, causing material to be displaced from the target and deposited as a film on a substrate placed in the chamber.

Accordingly, control of the deposition process is essential as device dimensions shrink. Further, controlling the plasma to be even across the sputtering target provides for an improved erosion profile and even wear of the target material over time and controls for target age.

Plasma sputtering may be accomplished using either DC sputtering or RF sputtering. Plasma sputtering typically includes a magnetron positioned at the back of the sputtering target including at least two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

Current hardware solutions for plasma control in PVD processes rely on these solid state magnets in varying configurations which are rotated behind the target. The tuning or modification of the magnet configuration requires extensive hardware work and chamber down time. Accordingly, there is a need for a hardware solution which allows for software control of the magnetic field and eliminates the need for new magnet designs.

The thickness tolerances on many optical multilayer coating stacks can be very demanding and require precise deposition control and monitoring. In addition to the common problems associated with process control and layer thickness monitoring, particularly for coatings with small error tolerances, large substrates add another difficulty in that the non-uniformity of coating thickness may exceed the error tolerance of the design.

Accordingly, there is also a need for methods and apparatus to control plasma profiles in PVD deposition processes in order to control deposition rates, film properties and other process improvements.

SUMMARY

One or more embodiments of the disclosure are directed to a plasma cathode assembly comprising a cathode housing having a top, sidewalls and a backing plate enclosing an interior volume with a center axis. The backing plate is configured to support a target during a sputtering process. A first EM coil is inside the interior volume of the cathode housing. The first EM coil has a first inner diameter and a first outer diameter defining a first coil width and a first bottom surface and a first top surface defining a first coil thickness. A second EM coil is inside the interior volume of the cathode housing. The second EM coil has a second inner diameter and a second outer diameter defining a second coil width and a second bottom surface and a second top surface defining a second coil thickness. The first EM coil is within the second inner diameter of the second EM coil.

Additional embodiments of the disclosure are directed to a plasma processing chamber comprising a chamber body comprising a bottom, sidewalls and a lid enclosing a process volume. A substrate holder is positioned within the process volume. A plasma cathode assembly is positioned above the substrate holder. The plasma cathode assembly comprises a cathode housing having a top, sidewalls and a backing plate enclosing an interior volume with a center axis. The backing plate is configured to support a target. A first EM coil is inside the interior volume of the cathode housing. The first EM coil has a first inner diameter and a first outer diameter defining a first coil width. A second EM coil is inside the interior volume of the cathode housing. The second EM coil has a second inner diameter and a second outer diameter defining a second coil width. The first EM coil is within the second inner diameter of the second EM coil.

Further embodiments of the disclosure are directed to a method of tuning a plasma profile. The method comprises one or more of: controlling spacing of EM coils within a plasma cathode assembly; modulating a direction or quantity of current flow through EM coils within a plasma cathode assembly; or controlling a position of EM coils within a plasma cathode assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

Embodiments of the present disclosure relate to plasma cathode assemblies comprising a plurality of electromagnetic (EM) coils behind the target material. The EM coils are positioned such that the one coil is within another coil. Further embodiments of the present disclosure relate to methods of using the plasma cathode assemblies disclosed herein to control the plasma field in a PVD deposition chamber. In some embodiments, the plasma density and/or plasma location is controlled.

Some embodiments of the disclosure advantageously provide rapid (e.g, real-time) tuning of the plasma profile in a plasma based deposition process (e.g., physical vapor deposition, PVD). Some embodiments of the disclosure advantageously provide a significant reduction in development time for new PVD processes. Similarly, some embodiments of the disclosure advantageously provide deposition processes with controlled deposition rates.

Some embodiments of the disclosure advantageously provide full face erosion of the target material. Some embodiments of the disclosure advantageously provide the ability to manipulate film properties during deposition processes. In some embodiments, the real time control and ability to manipulate film properties enable processes which deposit films with multi-layer properties.

Figure 1:
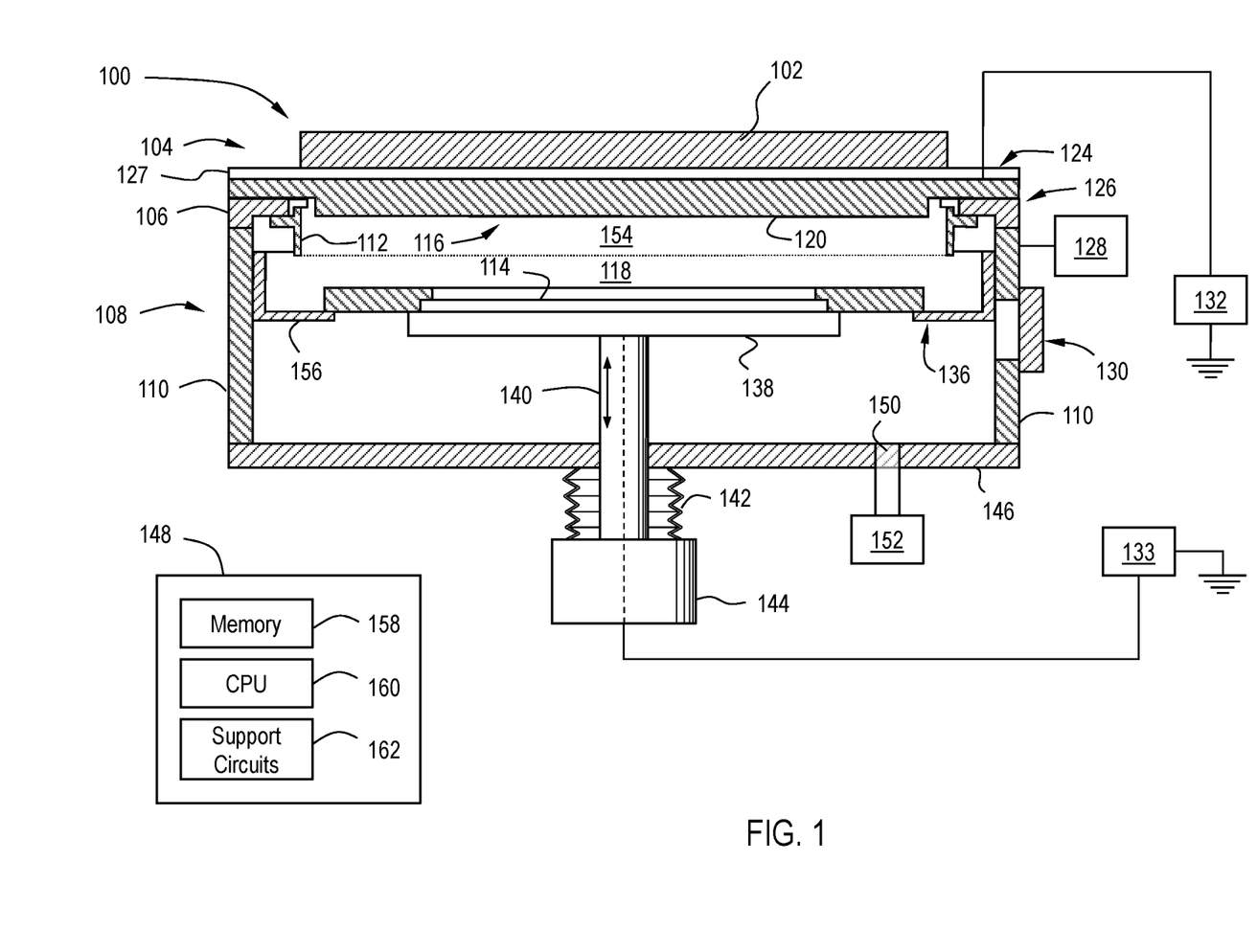
FIG. 1 is a cross section side view of a PVD deposition chamber according to one or more embodiments of the disclosure.

FIG. 1 illustrates a generalized physical vapor deposition (PVD) chamber 100, also referred to as a "sputtering chamber", "process chamber", or a "sputter process chamber", suitable for sputter depositing materials according to one or more embodiment of the invention. The process chamber 100 includes a chamber body 108 having a processing volume 118 defined therein. The chamber body 108 has sidewalls 110 and a bottom 146. The dimensions of the chamber body 108 and related components of the process chamber 100 are not limited and generally are proportionally larger than the size of the substrate 114 to be processed. Any suitable substrate size may be processed and the size of the processing chamber 100 can be potentially unlimited.

A lid assembly 104 is mounted on the top of the chamber body 108. The chamber body 108 may be fabricated from aluminum or other suitable materials. A substrate access port 130 is formed through the sidewall 110 of the chamber body 108, facilitating the transfer of a substrate 114 (i.e., a solar panel, a flat panel display substrate, a semiconductor wafer, or other workpiece) into and out of the process chamber 100. The access port 130 may be coupled to a transfer chamber and/or other chambers of a substrate processing system.

A gas source 128 is coupled to the chamber body 108 to supply process gases into the processing volume 118. In various embodiments, the process gases may include inert gases, non-reactive gases, and reactive gases. Examples of process gases that may be provided by the gas source 128 include, but not limited to, argon gas (Ar), helium (He), nitrogen gas ($N_2$), oxygen gas ($O_2$), hydrogen gas ($H_2$) and combinations thereof. Other processing gases are contemplated and are included within the scope of the invention.

A pumping port 150 is formed through the bottom 146 of the chamber body 108. A pumping device 152 is coupled to the process volume 118 to evacuate and control the pressure therein. In one embodiment, the pressure level of the process chamber 100 may be maintained in the range of about $10^{-10}$ Torr to about 1 Torr. In specific embodiments, the pressure is maintained within the range of about 0.1 mTorr to about 10 mTorr.

The lid assembly 104 generally includes a target 120 and a ground shield assembly 126 coupled thereto. The target 120 provides a material source that can be sputtered and deposited onto the surface of the substrate 114 during a PVD process. The lid assembly 104 may also include a chamber ceiling 127 which can be on top of the target 120, or around the target 120. In some embodiments, the target 120 may act as the ceiling 127. The target 120 may be placed adjacent the chamber ceiling. The target 120 or target plate may be fabricated from a material utilized for deposition species. A very high frequency power (VHF) source 132 and a high-frequency (HF) power source 133 are connected to the target 120 to facilitate sputtering materials from the target 120. The target 120 may be fabricated from any suitable material, including both conductive and non-conductive materials.

The target 120 generally includes a peripheral portion 124 and a central portion 116. In some embodiments, the peripheral portion 124 is disposed over the sidewalls 110 of the chamber. The central portion 116 of the target 120 may have a curvature surface slightly extending towards the surface of the substrate 114 disposed on a substrate support 138. The spacing between the target 120 and the substrate support 138 may be controlled. In some embodiments, the spacing is maintained between about 50 mm and about 150 mm, but other spacing is within the scope of the invention. It is noted that the dimension, shape, materials, configuration and diameter of the target 120 may be varied for specific process or substrate requirements. In some embodiments, the target 120 may further include a backing plate having a central portion bonded and/or fabricated by a material desired to be sputtered onto the substrate surface. The target 120 may also include adjacent tiles or segment materials that together forming the target.

Optionally, the lid assembly 104 may further comprise a magnetron assembly 102 mounted above the target 120 which enhances efficient sputtering materials from the target 120 during processing. Examples of the magnetron assembly include a linear magnetron, a serpentine magnetron, a spiral magnetron, a double-digitated magnetron, a rectangularized spiral magnetron, among others.

The ground shield assembly 126 of the lid assembly 104 includes a ground frame 106 and a ground shield 112. The ground shield assembly 126 may also include other chamber shield member, target shield member, dark space shield, dark space shield frame. The ground shield 112 is coupled to the peripheral portion 124 by the ground frame 106 defining an upper processing region 154 below the central portion of the target 120 in the process volume 118. The ground frame 106 electrically insulates the ground shield 112 from the target 120 while providing a ground path to the chamber body 108 of the process chamber 100 through the sidewalls 110. The ground shield 112 constrains plasma generated during processing within the upper processing region 154 and dislodges target source material from the confined central portion 116 of the target 120, thereby allowing the dislodged target source to be mainly deposited on the substrate surface rather than sidewalls 110. In one embodiment, the ground shield 112 may be formed by one or more work-piece fragments and/or a number of these pieces bonding by processes known in the art, such as welding, gluing, high pressure compression, etc.

The embodiment shown in FIG. 1 further includes a shaft 140 extending through the bottom 146 of the chamber body 108 couples to a lift mechanism 144. The lift mechanism 144 is configured to move the substrate support 138 between a lower transfer position and an upper processing position. A bellows 142 circumscribes the shaft 140 and coupled to the substrate support 138 to provide a flexible seal therebetween, maintaining vacuum integrity of the processing volume 118.

A shadow frame 122 may be disposed on the periphery region of the substrate support 138 and is configured to confine deposition of source material sputtered from the target 120 to a desired portion of the substrate surface. A chamber shield 136 may be disposed on the inner wall of the chamber body 108 and have a lip 156 extending inward to the processing volume 118 configured to support the shadow frame 122 disposed around the substrate support 138. As the substrate support 138 is raised to the upper position for processing, an outer edge of the substrate 114 disposed on the substrate support 138 is engaged by the shadow frame 122 and the shadow frame 122 is lifted up and spaced away from the chamber shield 136. When the substrate support 138 is lowered to the transfer position adjacent to the substrate access port 130, the shadow frame 122 is set back on the chamber shield 136. Lift pins (not shown) are selectively moved through the substrate support 138 to lift the substrate 114 above the substrate support 138 to facilitate access to the substrate 114 by a transfer robot or other suitable transfer mechanism.

At least one controller 148 is coupled to the process chamber 100 and/or the various components thereof. For example, the controller 148 may be configured to control the process sequence, regulating the gas flows from the gas source 128 into the chamber 100, the power and frequency of the power sources to control ion bombardment of the target 120, the density of the plasma and the degree of ionization of the sputtered species.

In some embodiments, there are more than one controller 148 connected to the individual components and a primary control processor is coupled to each of the separate controllers to control the chamber 100. The controller 148 may be one of any form of general-purpose computer processor, microcontroller, microprocessor, etc., that can be used in an industrial setting for controlling various chambers and sub-processors.

The at least one controller 148 can have a processor 160, a memory 158 coupled to the processor 160, input/output devices coupled to the processor 160, and support circuits 162 to communication between the different electronic components. The memory 158 can include one or more of transitory memory (e.g., random access memory) and non-transitory memory (e.g., storage).

The memory 158, or computer-readable medium, of the processor 160 may be one or more of readily available memory such as random access memory (RAM), read-only memory (ROM), floppy disk, hard disk, or any other form of digital storage, local or remote. The memory 158 can retain an instruction set that is operable by the processor 160 to control parameters and components of the chamber 100. The support circuits 162 are coupled to the processor 160 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor.

Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 148 has one or more configurations to execute individual processes or sub-processes to perform the method. The controller 148 can be connected to and configured to operate intermediate components to perform the functions of the methods. For example, the controller 148 can be connected to and configured to control one or more of gas valves, actuators, motors, slit valves, vacuum control, power supplies, etc.

During processing, the material sputtered from the target 120 is ionized in the plasma and is deposited on the surface of the substrate 114. The target 120 and the substrate support 138 are biased relative to ground by the VHF power source 132 and the HF power source 133 to maintain a plasma formed from the process gases supplied by the gas source 128, form ions within the plasma, and cause directional sputtering of the ions onto the substrate 114. Ions and excited species within the plasma strike the target 120, causing target material to be dislodged from the target 120. The dislodged target material and process gases experience energetic collisions within the plasma, resulting in the formation of ionic target materials which are accelerated toward the substrate 114, forming a layer on the substrate 114 with same composition as the target 120.

One or more embodiments of the invention are directed to methods of processing a substrate in a physical vapor deposition (PVD) vacuum chamber 100. A target 120 is provided adjacent a ceiling 127 of the chamber. Alternatively, the target 120 can act as the ceiling 127 of the chamber 100, or the ceiling 127 can be located above the magnetron assembly 102. A substrate 114 is placed on a substrate support 138 facing the target 120. A process gas is introduced into the chamber 100 to a selected pressure from a process gas source 128. The pressure of the process gas is adjusted to be high enough to cause ionization of a substantial portion of species sputtered from the target. A capacitively coupled high density plasma is maintained by applying a first power at a first frequency to the target at a frequency sufficiently high to excite kinetic electrons. A second power is applied to the substrate at a second frequency, lower than the first frequency, to generate a sheath potential sufficient to sputter ions from the target onto the substrate to deposit a film of the sputtered ions from the target. One or more of the selected pressure and the sheath potential can be controlled to control the microstructure of the deposited film.

In specific embodiments, the power supplied to the target comprises substantially no direct current component. When direct current is supplied, in particular, to targets composed of non-conductive materials, there is a tendency for an arc to occur within the chamber. Arcing usually results in damage to the substrate being sputtered. Embodiments of the methods are capable of producing and tuning the plasma density and sputter rate without the use of DC power.

The target material is selected based on the desired film being formed. A feature of sputtering is that the film formed has the same composition as the target material. Therefore, the target can be a metal, a pure species, a doped species, etc. with result being that the film is formed of the same material. In one or more embodiments, the target is selected from the group consisting of silicon, doped silicon, zinc oxide, indium tin oxide, transparent conductive oxide, metals and combinations thereof. In a detailed embodiment, the target is silicon, with or without a dopant.

The substrate support 138 can include a heating or cooling system, allowing the temperature of the substrate support 138 and the substrate 114 to be changed. In one or more embodiments of the invention, the temperature of the substrate is controlled. Those skilled in the art will recognize suitable processing parameters including powers, frequencies, temperatures, pressures and the like.

Some embodiments of the disclosure are directed to plasma cathode assemblies. The plasma cathode assemblies described herein may be understood as the lid assembly 104 of the processing chamber 100 described above.

Figure 2:
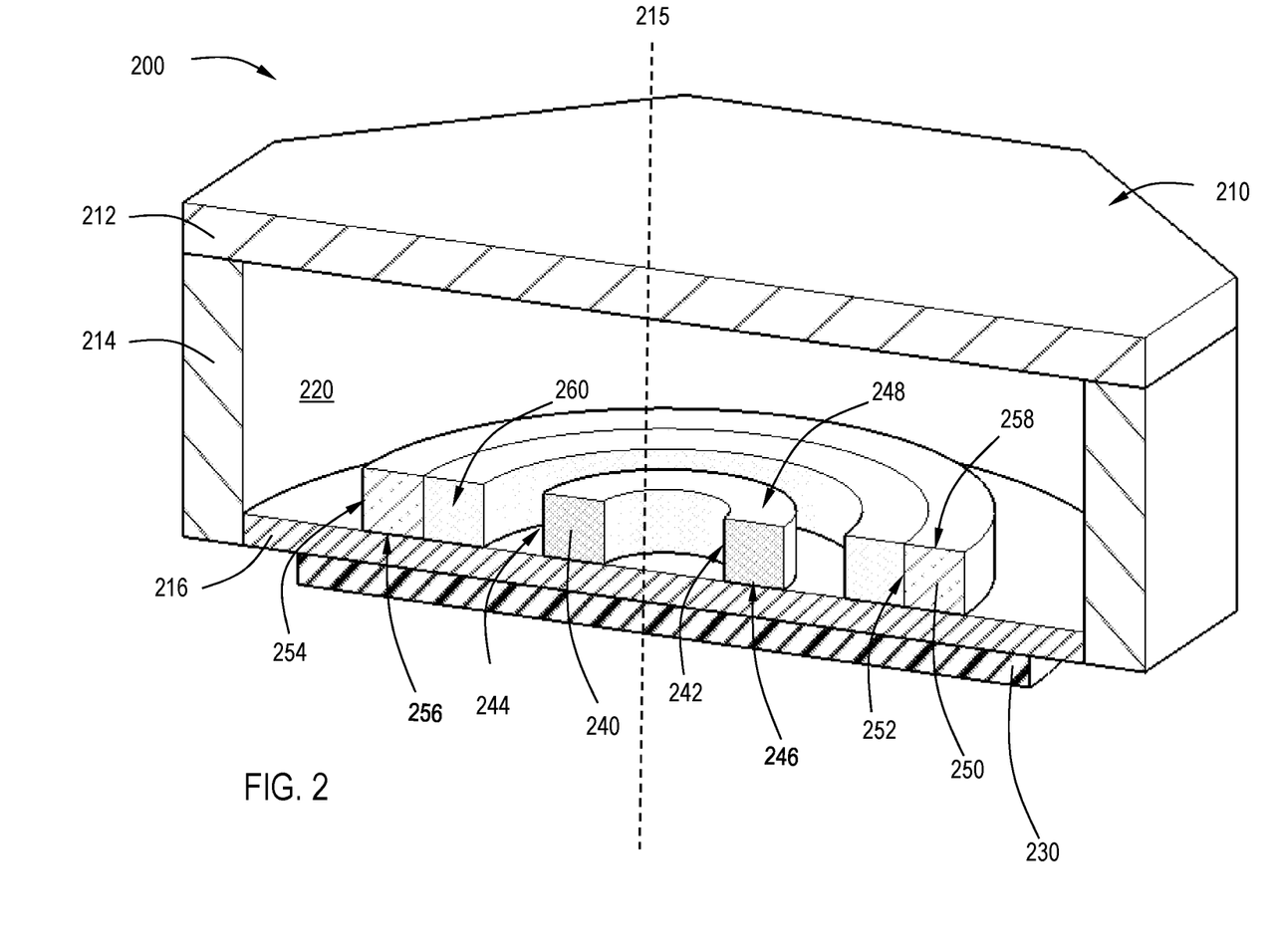
FIG. 2 is a cross sectional perspective view of a plasma cathode assembly according to one or more embodiment of the disclosure.

FIG. 2 illustrates a plasma cathode assembly 200 according to one or more embodiment of the disclosure. The plasma cathode assembly 200 comprises a cathode housing 210 having a top 212, sidewalls 214 and a backing plate 216 enclosing an interior volume 220 with a center axis 215. In some embodiments, the backing plate 216 is configured to support a target 230 during a sputtering process.

The plasma cathode assembly 200 further comprises a first EM coil 240 inside the interior volume 220 of the cathode housing 210. The first EM coil 240 has a first inner diameter 242 and a first outer diameter 244 defining a first coil width W1 and a first bottom surface 246 and a first top surface 248 defining a first coil thickness T1.

The plasma cathode assembly 200 comprises a second EM coil 250 inside the interior volume 220 of the cathode housing 210. The second EM coil 250 has a second inner diameter 252 and a second outer diameter 254 defining a second coil width W2 and a second bottom surface 256 and a second top surface 258 defining a second coil thickness T2.

The first EM coil 240 is within the second inner diameter 252 of the second EM coil 250. While FIG. 2 shows three EM coils, it is noted that only two EM coils are required for some embodiments of the present disclosure.

In some embodiments, the plasma cathode assembly 200, further comprises at least one additional EM coil 260 within the interior volume 220 of the cathode housing 210. Each additional EM coil has an inner diameter and an outer diameter defining a coil width and a bottom surface and a top surface defining a coil thickness. Further, each additional EM coil is positioned so at least one of the first EM coil 240 or second EM coil 250 is within the inner diameter of the additional EM coil 260. In some embodiments, the plasma cathode comprises more than two EM coils. In some embodiments, the plasma cathode comprises six or more EM coils.

Figure 5:
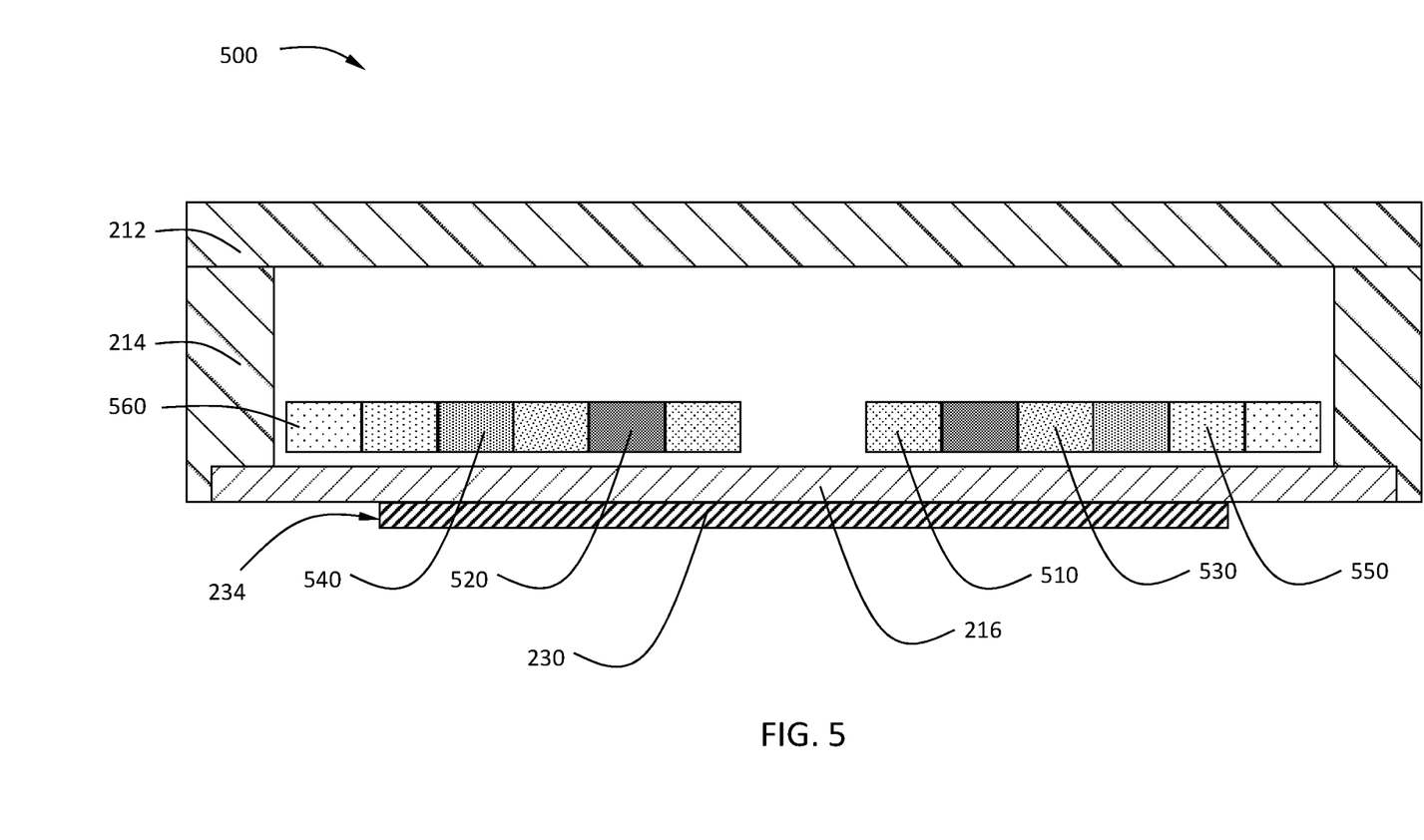
FIG. 5 illustrates a cross sectional view of a plasma cathode assembly according to one or more embodiment of the disclosure.

FIG. 5 illustrates a plasma cathode assembly 500 with 6 coils (510-560). In some embodiments, the outermost coil 560 is positioned near the outer diameter 234 of the target 230 on the backing plate 216. As used in this regard, "near" means that the outer coil 560 diameter is within ±5%, within ±2%, within ±1%, or within ±0.5% of the diameter of the target 230.

In some embodiments, the outermost coil 560 is positioned outside of the outer diameter 234 of the target 230 on the backing plate 216. In some embodiments, the outermost coil 560 is positioned inside of the outer diameter 234 of the target 230 on the backing plate 216. As used in this regard, when the outermost coil 560 is positioned inside or outside of the outer diameter 234 of the target 230, the coil 560 and the target 230 are concentric with the target having a larger or smaller outer diameter 234 than the inner diameter of the outermost coil 560, respectively.

In some embodiments, the inner coils (510-550) are run in a first direction while the outermost coil 560 is run in an opposite second direction. Without being bound by theory, it is believed that positioning a coil outside of the cathode face and run in the opposite direction allows for containment of the magnetic field. The containment of the magnetic field reduces the amount of material deposited on the process kit.

While the description and drawings discuss and show circular EM coils, the disclosure is not limited to EM coils of any specific shape. Coils may be circular, oval, polygonal or any combination thereof.

Further, while the description and drawings discuss and show EM coils within a shared plane, the disclosure is not limited to EM coils within a shared plane. The coils may be shifted vertically such that they entirely overlap (as shown), partially overlap or have not vertical overlap.

In some embodiments, as shown in FIG. 2, the first EM coil 240 and the second EM coil 250 are positioned concentrically. In some embodiments, the first EM coil 240 and the second EM coil 250 are not positioned concentrically.

In some embodiments, the center of one or both of the EM coils 240, 250 is at the center axis 215. In some embodiments, neither the center of the first EM coil 240 nor the center of the second EM coil 250 is at the center axis.

In some embodiments, at least one of the first EM coil 240 and the second EM coil 250 is moveable relative to the cathode housing 210. In some embodiments, the at least one coil translates. The translation movement described herein may be understood to include movement within a plane perpendicular to the center axis 215. In some embodiments, at least one EM coil rotates. The rotation described herein may be understood as rotation around an axis parallel to the center axis 215.

Figure 3A:
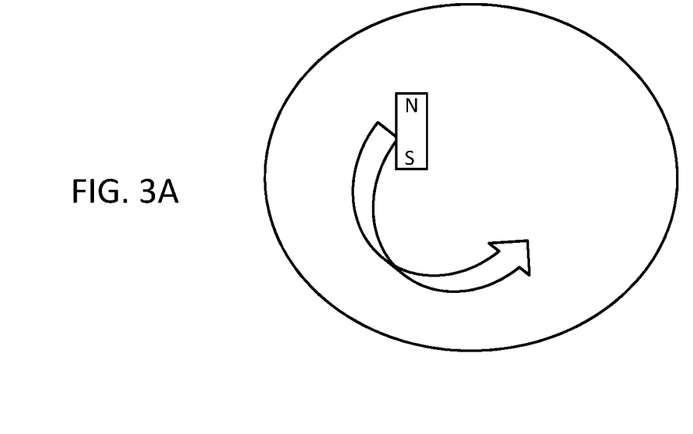
FIGS. 3A-3C illustrate the modification of a magnetic field caused by the rotation of a bar magnet.
Figure 3B:
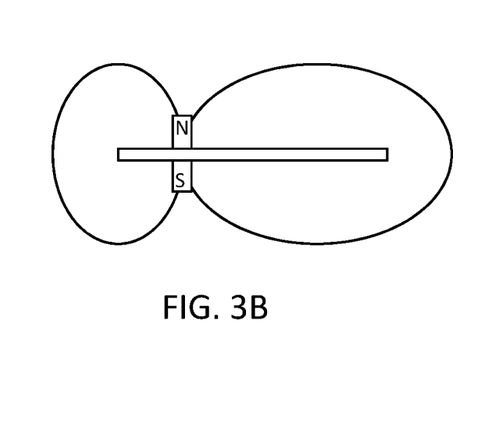
Figure 3C:
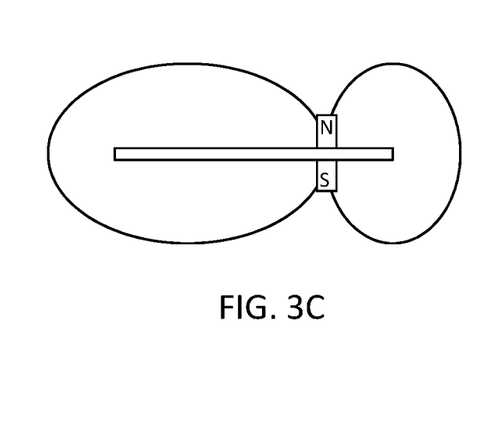

Without being bound by theory, it is believed that the movement of the activated EM coils during processing may allow the magnetic field produced therefrom to be distorted. Stated differently, the movement of the activated EM coils may modify the shape of the magnetic field produced therefrom. As shown in FIGS. 3A-3C, it is understood that when a bar magnet is quickly translated in a circular motion the magnetic field produced therefrom is distorted as shown in FIGS. 3B and 3C.

As used herein, the term EM coil refers to a coil of conductive material. When a current is passed through the material, the activated EM coil operates as an electromagnet.

Some embodiment of the disclosure relate to a processing chamber which comprises a plasma cathode assembly as disclosed herein.

As described above with respect to FIG. 1, some embodiments of the disclosure relate to plasma processing chambers. In some embodiments, the plasma processing chambers include a chamber body 108 comprising a bottom 146, sidewalls 110 and a ceiling 127 enclosing a process volume 118.

The plasma processing chamber further comprises a substrate support 138 positioned within the process volume 118. In some embodiments, the plasma processing chamber includes a plasma cathode assembly 200 positioned above the substrate support 138. The plasma cathode assembly 200 is as described above.

Some embodiments of the disclosure provide methods for tuning a plasma profile. In some embodiments, the methods use the plasma cathode assemblies described elsewhere herein.

The method of controlling the plasma profile comprises one or more of controlling spacing of EM coils within a plasma cathode assembly, modulating a direction or quantity of current flow through one or more EM coils within a plasma cathode assembly; or controlling a position of EM coils within a plasma cathode assembly.

Controlling the spacing of EM coils may comprise flowing current through non-adjacent coils while not flowing current through intervening coils. For example, a plasma cathode assembly may contain six EM coils of successively larger sizes. One could activate the outermost coil (ring 6) and the innermost coil (ring 1) without activating the other coils. One could also activate ring 6 and ring 4, ring 3 and/or ring 2. Each of the resulting magnetic fields is expected to have a different effect on the resulting plasma profile during processing.

In some embodiments, the plasma profile is controlled by modulating a direction or quantity of current flow through one or more EM coils within a plasma cathode assembly. For example, a predetermined EM coil may have alternating current flowed through the coil in order to activate the EM coil. The alternating current is expected to produce a different magnetic field than a direct current. Similarly, a pulsed current, either high/low or on/off is expected to produce a different magnetic field than a steady current.

In some embodiments, the plasma profile is controlled by controlling the position of EM coils within a plasma cathode assembly. In some embodiments, the position of the EM coils may be controlled only before plasma processing occurs. In these embodiments, an EM coil may be arranged concentrically or "off-center" from other EM coils or from the cathode housing. As the number of EM coils increases, the spatial options increase exponentially. Each of these spatial arrangements provides a different plasma profile.

Further, in some embodiments, the position of the EM coils may be controlled during plasma processing. In these embodiments an EM coil may be rotated or translated. These movements are described in more detail above. As shown in FIGS. 3B and 3C, the rotating bar magnet provides a distorted magnetic field when compared to a stationary bar magnet. These modifications in magnetic field allow for a controlled plasma profile as moving magnets may be able to provide distorted fields to provide shapes which would otherwise be unobtainable.

Similarly, in some embodiments the plasma cathode assembly 200 further comprises at least one permanent magnet 280. In some embodiments, the at least one permanent magnet 280 is positioned within the first inner diameter 242 of the first EM coil 240. In some embodiments, the at least one permanent magnet 280 rotates around the center axis 215.

Figure 4A:
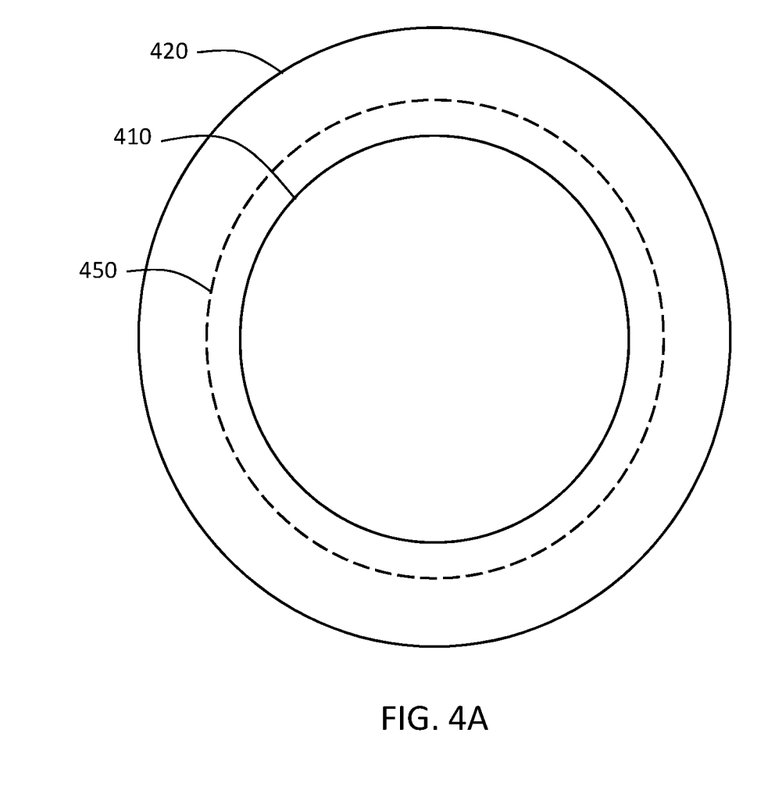
FIGS. 4A-4B illustrate the modification of a magnetic field caused by permanent magnets near the central axis.
Figure 4B:
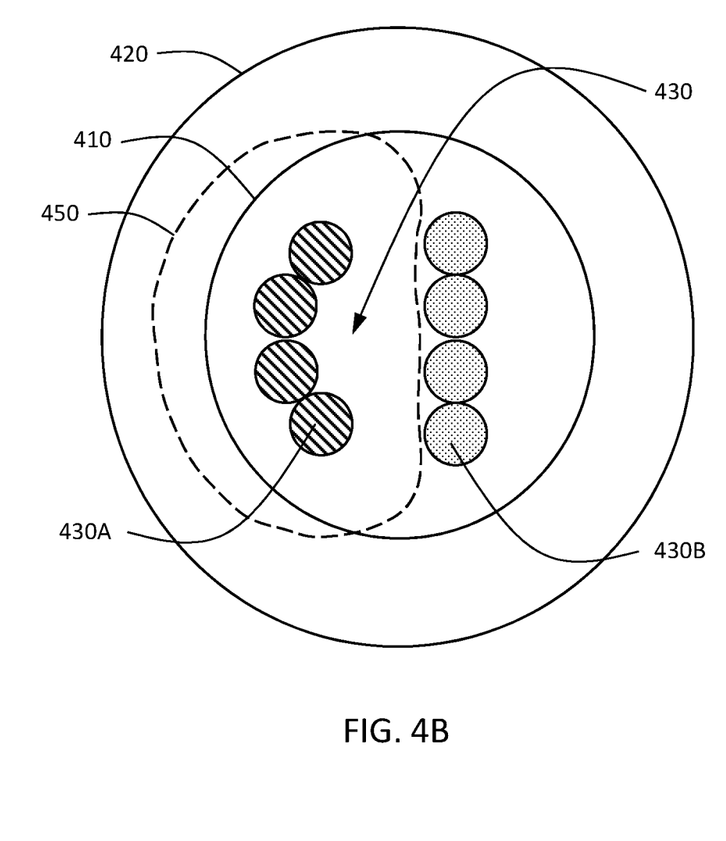

As shown in FIGS. 4A and 4B, the at least one magnet, when present, provides a distorted magnetic field. FIG. 4A illustrates a top view of the magnetic field when an inner coil 410 and an outer coil 420 are run with opposing current. For simplicity, the inner coil 410 and the outer coil 420 are shown as the midline of the coil. For FIG. 4A, the tangential magnetic field 450 is shown as a dashed line as is generally circular and concentric with the inner coil 410 and the outer coil 420.

In contrast, FIG. 4B illustrates a top view of the magnetic field when a plurality of permanent magnets 430 are placed within the inner coil 410. For the simulated results shown in FIG. 4B, permanent magnets 430A have the south pole closest to the viewer and permanent magnets 430B have the north pole closest to the viewer. The tangential magnetic field 450 (shown as a dashed line) is "D-shaped", with one side bent inward by the permanent magnets 430.

In some embodiments, the methods of tuning a plasma profile tune one or more of plasma location or plasma density. In some embodiments, the tuned plasma profile allows for full face erosion of the target material.

Existing magnetron arrangements do not allow for the target material at the edge of the target to be affected by the magnetic fields produced by the magnetron. This results in erosion profiles which do not affect the edge of the target as much as other portions. Without being bound by theory, the EM coils enable tangential fields directly below the coils, thereby allowing for erosion up to and including the target edge.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A plasma cathode assembly comprising:
   a cathode housing having a top, sidewalls and a backing plate enclosing an interior volume with a center axis, the backing plate configured to support a target with an outer diameter during a sputtering process;
   a first EM coil inside the interior volume of the cathode housing, the first EM coil having a first inner diameter and a first outer diameter defining a first coil width, and a first bottom surface and a first top surface defining a first coil thickness;
   a second EM coil inside the interior volume of the cathode housing, the second EM coil having a second inner diameter and a second outer diameter defining a second coil width and a second bottom surface and a second top surface defining a second coil thickness, wherein the first EM coil is within the second inner diameter, the second inner diameter is smaller than the outer diameter of the target, and the second outer diameter is outside of the outer diameter of the target; and
   a plurality of permanent magnets within the first inner diameter of the first EM coil, the plurality of permanent magnets rotating about the center axis of the cathode housing, the first EM coil and the second EM coil configured to enable a tangential magnetic field to be formed directly below the coils by the plurality of permanent magnets having a "D" shape.

2. The plasma cathode assembly of claim 1, wherein the first EM coil and the second EM coil are positioned concentrically.

3. The plasma cathode assembly of claim 1, wherein at least one of the first EM coil or the second EM coil are positioned such that a center of the first EM coil or the second EM coil is in alignment with the center axis of the cathode housing.

4. The plasma cathode assembly of claim 1, wherein at least one of the first EM coil and the second EM coil is moveable relative to the cathode housing.

5. The plasma cathode assembly of claim 4, wherein the moveable EM coil translates.

6. The plasma cathode assembly of claim 1, further comprising at least one additional EM coil within the interior volume of the cathode housing, each additional EM coil having an inner diameter and an outer diameter defining a coil width and a bottom surface and a top surface defining a coil thickness, wherein each additional EM coil is positioned so at least one of the first EM coil or second EM coil is within the inner diameter of the additional EM coil.

7. The plasma cathode assembly of claim 1, wherein at least one permanent magnet is a north pole permanent magnet and at least one permanent magnet is a south pole permanent magnet.

8. A plasma processing chamber comprising:
   a chamber body comprising a bottom, sidewalls and a ceiling enclosing a process volume;
   a substrate support positioned within the process volume; and
   a plasma cathode assembly positioned above the substrate support, the plasma cathode assembly comprising:
      a cathode housing having a top, sidewalls and a backing plate enclosing an interior volume with a center axis, the backing plate configured to support a target with an outer diameter;
      a first EM coil inside the interior volume of the cathode housing, the first EM coil having a first inner diameter and a first outer diameter defining a first coil width;
      a second EM coil inside the interior volume of the cathode housing, the second EM coil having a second inner diameter and a second outer diameter defining a second coil width, wherein the first EM coil is within the second inner diameter, the second inner diameter is smaller than the outer diameter of the target, and the second outer diameter is outside of the outer diameter of the target;
      a plurality of permanent magnets within the first inner diameter of the first EM coil, the plurality of permanent magnets rotating about the center axis of the cathode housing, the first EM coil and the second EM coil configured to enable a tangential magnetic field to be formed directly below the coils by the plurality of permanent magnets having a "D" shape.

9. The plasma processing chamber of claim 8, wherein the first EM coil and the second EM coil are positioned concentrically and at least one of the first EM coil or the second EM coil are positioned such that a center of the first EM coil or the second EM coil is in alignment with the center axis of the cathode housing.

10. The plasma processing chamber of claim 8, wherein at least one of the first EM coil and the second EM coil is moveable relative to the cathode housing.

11. The plasma processing chamber of claim 8, wherein the plasma cathode assembly further comprises at least one additional EM coil within the interior volume of the cathode housing, each additional EM coil having an inner diameter and an outer diameter defining a coil width, wherein each additional EM coil is positioned so at least one of the first EM coil or second EM coil is within the inner diameter of the additional EM coil.

12. The plasma processing chamber of claim 8, wherein at least one permanent magnet is a north pole permanent magnet and at least one permanent magnet is a south pole permanent magnet.

13. The plasma cathode assembly of claim 1, further comprising a controller configured to control at least one of a spacing of the EM coils and a position of the EM coils within the plasma cathode assembly to control a profile of the plasma.

14. The plasma processing chamber of claim 8, further comprising a controller configured to control at least one of a spacing of the EM coils and a position of the EM coils within the plasma cathode assembly to control a profile of the plasma.

* * * * *